United States Patent
Jonkers et al.

(10) Patent No.: US 8,173,975 B2
(45) Date of Patent: May 8, 2012

(54) METHOD AND DEVICE FOR REMOVING PARTICLES GENERATED BY MEANS OF A RADIATION SOURCE DURING GENERATION OF SHORT-WAVE RADIATION

(75) Inventors: Jeroen Jonkers, Aachen (DE); Levinus Pieter Bakker, Helmond (NL); Frank Jeroen Pieter Schuurmans, Valkenswaard (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 714 days.

(21) Appl. No.: 10/599,345

(22) PCT Filed: Mar. 18, 2005

(86) PCT No.: PCT/IB2005/050941
§ 371 (c)(1),
(2), (4) Date: May 7, 2009

(87) PCT Pub. No.: WO2005/096099
PCT Pub. Date: Oct. 13, 2005

(65) Prior Publication Data
US 2009/0206279 A1    Aug. 20, 2009

(30) Foreign Application Priority Data

Mar. 31, 2004  (EP) .................................... 04101311

(51) Int. Cl.
*G21K 5/00* (2006.01)
(52) U.S. Cl. ............... 250/492.1; 250/503.1; 250/504 R

(58) Field of Classification Search .............. 250/396 R, 250/428, 431, 492.1, 492.2, 492.22, 493.1, 250/504 R
See application file for complete search history.

(56) References Cited

U.S. PATENT DOCUMENTS

| | | | |
|---|---|---|---|
| 5,949,076 A * | 9/1999 | Ohtoshi et al. ............ | 250/396 R |
| 6,232,613 B1 * | 5/2001 | Silfvast et al. ............ | 250/504 R |
| 6,842,221 B1 * | 1/2005 | Shiraishi ........................ | 355/30 |
| 2003/0053594 A1 | 3/2003 | Fornaciari et al. | |
| 2003/0071979 A1 | 4/2003 | Visser | |
| 2004/0032574 A1 * | 2/2004 | Koster et al. .................... | 355/30 |
| 2005/0122491 A1 | 6/2005 | Bakker et al. | |

FOREIGN PATENT DOCUMENTS

| | | |
|---|---|---|
| EP | 1211918 A1 | 6/2002 |
| EP | 1531365 A1 | 5/2005 |
| WO | 0028384 A1 | 5/2000 |
| WO | 0195362 A1 | 12/2001 |
| WO | 02054153 A1 | 7/2002 |

* cited by examiner

*Primary Examiner* — David A Vanore
*Assistant Examiner* — Nicole Ippolito

(57) ABSTRACT

A method for removing contaminant particles, such as atoms, molecules, clusters, ions, and the like, produced by a radiation source during generation of short-wave radiation having a wavelength of up to approximately 20 nm, includes guiding a first gas between the radiation source and a particle trap arranged in a wall of a chamber. In order to protect an optical device and/or articles to be irradiated against contamination, the method introducing a second gas into the chamber and its pressure is adjusted such that it is at least as high as the pressure of the first gas.

20 Claims, 3 Drawing Sheets

Figure 1:
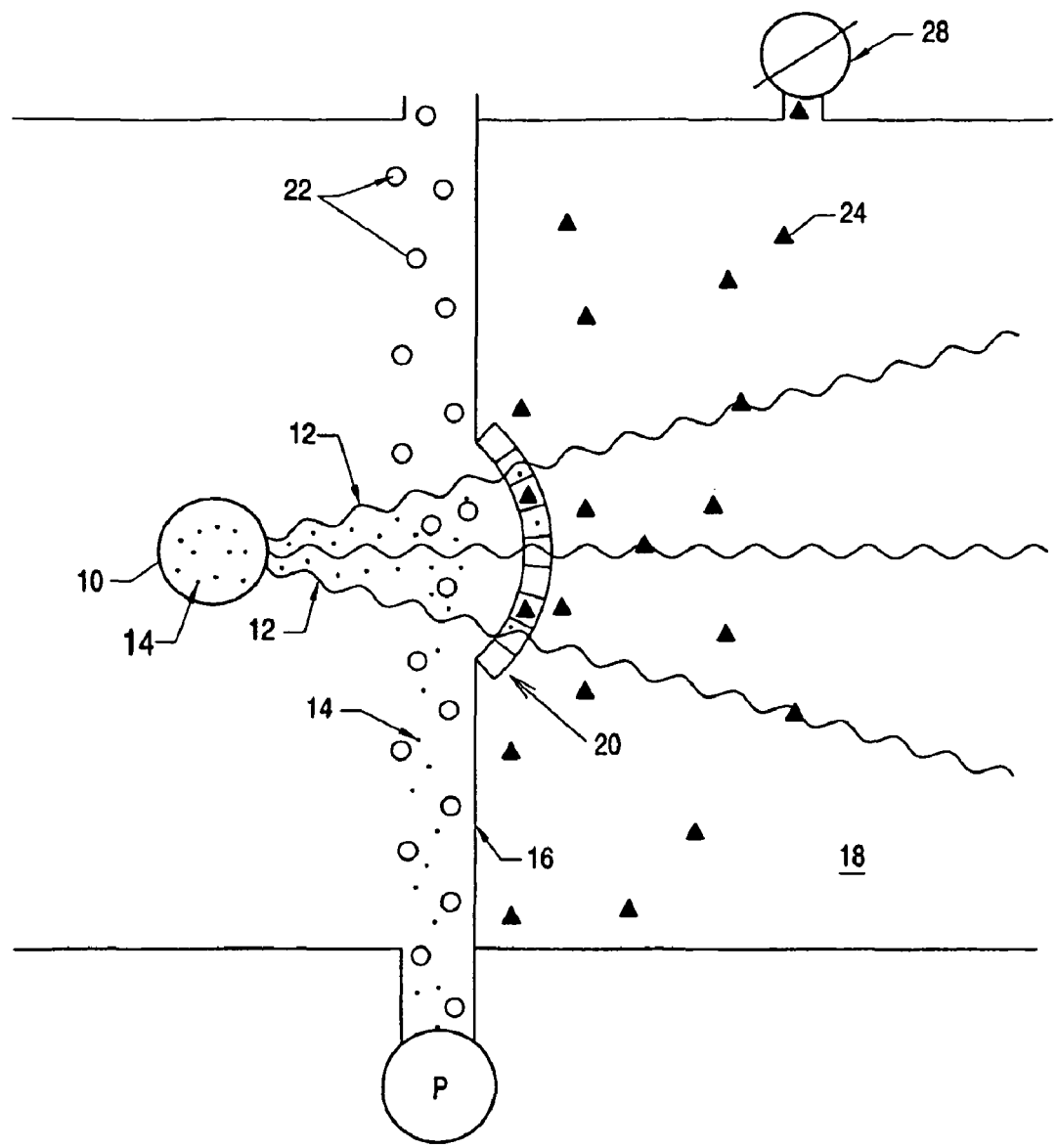

METHOD AND DEVICE FOR REMOVING PARTICLES GENERATED BY MEANS OF A RADIATION SOURCE DURING GENERATION OF SHORT-WAVE RADIATION

The invention relates to method and a device for removing particles, such as atoms, molecules, clusters, ions, and the like, generated by means of a radiation source during generation of short-wave radiation having a wavelength of up to approximately 20 nm, by means of a first gas guided at high mass throughput between the radiation source and a particle trap arranged in a wall of a mirror chamber. The method according to the invention and the device according to the invention can be used in connection with generating radiation in a wavelength range of approximately 2 nm up to approximately 20 nm in lithography or microscopy.

WO-A-00/28384 discloses such a method for a lithography device in which soft x-ray radiation and extreme ultraviolet radiation are used. In this device, a chamber containing a wafer is separated by means of a wall from optical devices. In the wall, an opening is provided that allows passage of a noble gas and of short-wave radiation. When irradiating the wafer with short-wave radiation, contaminants are released that can reach through the opening the optical devices. By means of a curtain of noble gas that is positioned in the vicinity of the wafer, it is possible to prevent the contaminant particles from reaching the optical devices because they collide with the particles of the noble gas. In particular, when irradiating the wafer with short-wave radiation, contaminants of a high molecular weight will result. Such particles can be slowed only insufficiently. When such molecules deposit on the optical device, for example, a mirror, its reflective properties drop drastically as a result of absorption phenomena. Also, so-called "thermal" particles with a high kinetic energy can be only minimally deflected despite their relatively minimal mass.

Typically, particles are also generated when operating a radiation source for short-wave radiation in the wavelength range of up to approximately 20 nm. The short-wave radiation of a modern high-performance source is generated within a plasma that is made available either by electric discharge or a focused laser pulse. In the case of electric discharge, particles that can absorb the short-wave radiation are inevitably produced as a result of the employed working gas and electrode erosion. In the case of laser-induced plasma, a so-called target is heated and evaporated within a short period of time by laser radiation. In the vapor phase, atoms and ions are produced within the plasma.

As a result of the very high temperature of the plasma in the order of several 10 eV, such particles of the plasma have a high kinetic energy. They can have a relatively great average free length of path within a vacuum chamber that is required, of course, for a loss-free transfer of the radiation produced within the plasma into a mirror chamber. In this way, it is possible that such particles can deposit on an optical device or an article to be irradiated. In particular, damage of the surfaces of a beam-guiding device, such as a collector mirror, by so-called sputtering is observed.

WO-A-02/054153 discloses an exposure system with a vacuum chamber wall in which a particle trap is arranged. This particle trap has a lamella-like structure that defines several neighboring narrow sectors. These sectors extend essentially parallel to the direction of propagation of the radiation. The sectors are provided with varying width and length.

A wall configured in this way and arranged between the radiation source and a mirror chamber enables an almost loss-free transfer of the short-wave radiation, wherein the particles accelerated in the direction toward the mirror chamber are retained by the lamella-like structure. Particularly particles having a relatively great mass that can be produced by plasma-chemical processes or upon erosion of an electrode material are not reliably retained by such a particle trap alone.

The invention has therefore the object to provide a method of the aforementioned kind which protects with simple measures optical devices and/or articles to be irradiated against contamination.

This object is solved for a method of the aforementioned kind in that a second gas is introduced into the mirror chamber and its pressure is adjusted such that it is at least as high as the pressure of the first gas.

In this connection, the realization that, as a result of the introduced second gas, passage of the first gas through the particle trap into the mirror chamber can be almost completely prevented, is especially important for the present invention. The slowed contaminant particles are therefore no longer transported by the particles of the first gas that otherwise would enter the mirror chamber. Entrainment of the contaminant particles by means of the employed first gas through the particle trap into the mirror chamber is prevented. The particle trap is practically made impenetrable for the first gas and/or the contaminant particles.

By means of the wall and the particle trap that is essentially transparent for the short-wave radiation, a sufficient spatial separation between the mirror chamber and the radiation source is achieved. The slowed or decelerated contaminant particles can be finally removed by vacuum. By means of the afore described particle trap, it is, for example, possible to guide different gases with different spatial orientation during operation of the radiation source by adjusting the width and/or the length of the sectors while simultaneously providing high permeability for the short-wave radiation.

The method can be improved in that the pressure of the second gas is adjusted such that it is higher than the pressure of the first gas.

Of course, the second gas introduced at a higher pressure into the mirror chamber flows through the sectors of the particle trap in the direction toward the radiation source. The contaminant particles that are generated by the radiation source in the opposite direction can be slowed or deflected by collision with the particles of the first gas.

Of course, since the short-wave radiation can be absorbed well by almost any material, the method according to the invention is usually carried out such that the high pressure of a gas is to be understood as a partial pressure of up to several 10 pascal. Typically, the partial pressure of a working gas of a radiation source operating by electrical discharge is approximately 10 pascal.

In an advantageous embodiment of the method, it is provided that the first gas is guided transversely to the propagation direction of the radiation within a channel that is at least partially laterally bounded.

The first gas can be guided between the particle trap and the radiation source, for example, such that the contaminant particles are transported away relatively quickly from the beam path of the short-wave radiation. The flow of the first gas, by means of the channel, removes the contaminant particles generated by the radiation source as well as, optionally, the particles of the second gas flowing through the particle trap. The particle-containing flow can be removed finally by means of a pump connected to the channel.

According to another advantageous embodiment of the method, it can be provided that the first gas is a noble gas with an atomic weight of at least 39 g/mol, for example, argon or krypton.

Without intending to limit the invention to a certain theory, collision between contaminant particles and particles of the first gas can achieve effective entrainment effects. In particular, clusters of a relatively high molecular weight can be transported away particularly efficiently by means of particles of the first gas having relatively great mass, velocity, and/or collision cross-section. Particularly by means of the high mass throughput of the first gas, the quantity of gas particles of the first gas can be adjusted in the area of the beam path of the short-wave radiation such that only a small fraction of the short-wave radiation will be absorbed thereby. For example, with a nozzle-shaped or jet-shaped channel that opens near the particle trap, a gas curtain can be generated that is maintained by a noble gas flow through the channel.

Advantageously, the method is carried out such that a substance that is essentially transparent for the radiation, for example, helium or hydrogen, is introduced as the second gas. The short-wave radiation guided through the particle trap can be guided within the mirror chamber across relatively large travel distances to different optical devices, for example, a mirror, a mask, or grating. In order to minimize the absorption of the short-wave radiation by means of the second gas introduced into the mirror chamber, a gas with a relatively high transmission for short-wave radiation is employed. For a partial pressure of 20 pascal, the transmission of hydrogen is approximately 97.6% per meter traveled. Under the same conditions, the transmission for helium is approximately 78% per meter traveled.

In another advantageous embodiment of the method, it is proposed that a flow velocity of the first gas and/or of the second gas is adjusted by means of appropriate devices.

Such devices can be, for example, pumps or valves. These devices are used, for example, for introducing, preferably at a constant flow velocity, the first gas and/or the second gas for generating a high mass throughput. The first gas and the second gas are provided in separate storage containers, for example, a gas cylinder.

When using vacuum pumps, for example, turbo pumps or turbo-molecular pumps, it is possible to quickly replace a second gas that is contaminated by diffusion effects with particles of the first gas with a new, pure second gas. In order to prevent contamination of the pump when removing the gas mixture contaminated with contaminant particles, appropriate filters can be employed. The filter can be a cold trap, for example.

The invention has furthermore the object to provide a device of the aforementioned kind that protects with simple features optical devices and/or articles to be irradiated against contamination.

This object is solved according to the invention for a device of the aforementioned kind in that a second gas can be introduced into the mirror chamber whose pressure is adjustable with appropriate devices to be at least as high as the pressure of the first gas.

Since the advantages of the further embodiments of the device disclosed in the dependent claims correspond essentially to those of the method according to the invention, a detailed description of these dependent claims is not provided here.

The method according to the invention and the device according to the invention can be used advantageously in connection with the generation of radiation in a wavelength range of approximately 2 nm up to approximately 20 nm for a lithography device or for a microscope.

Figure 2:
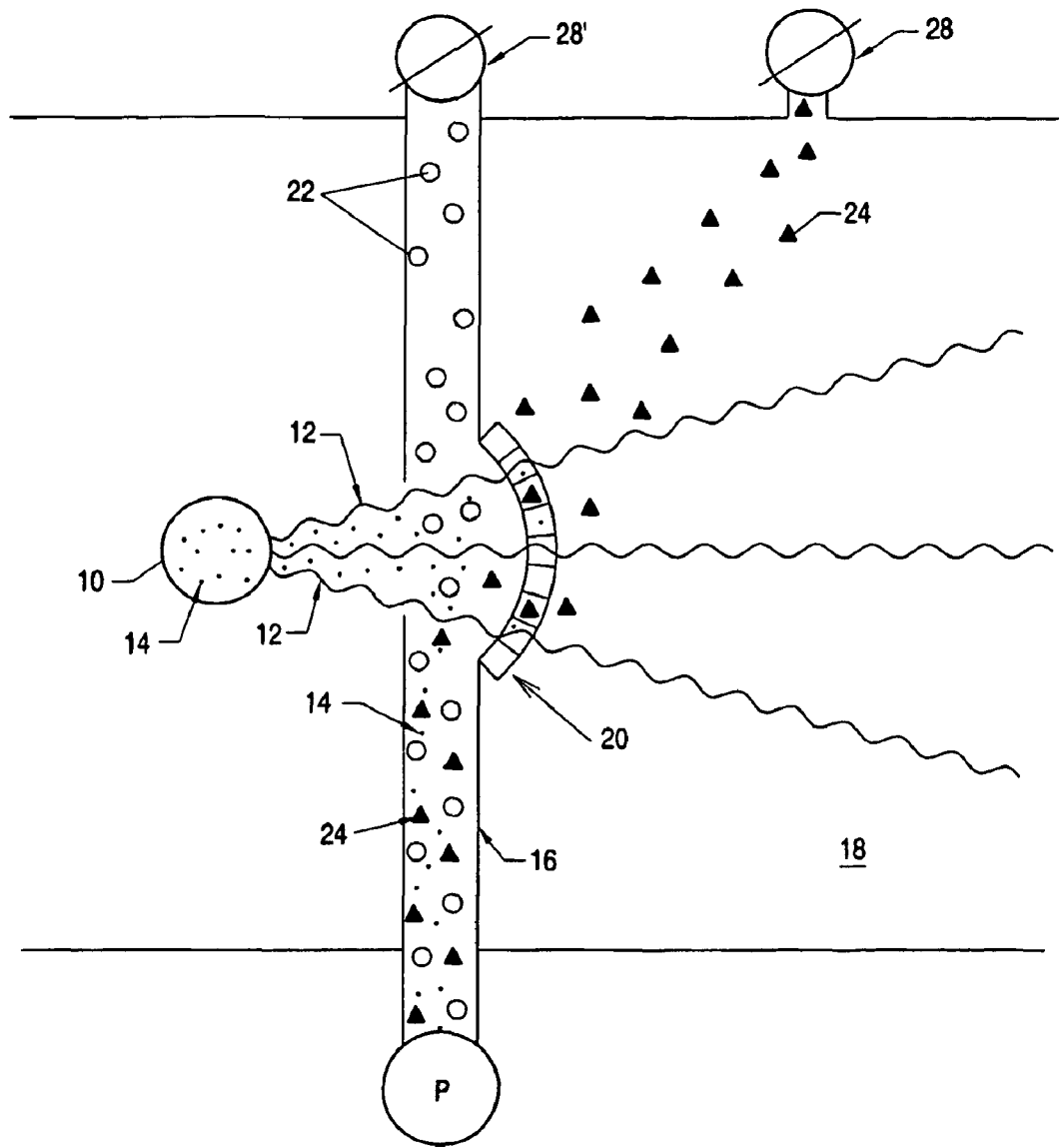
Figure 3:
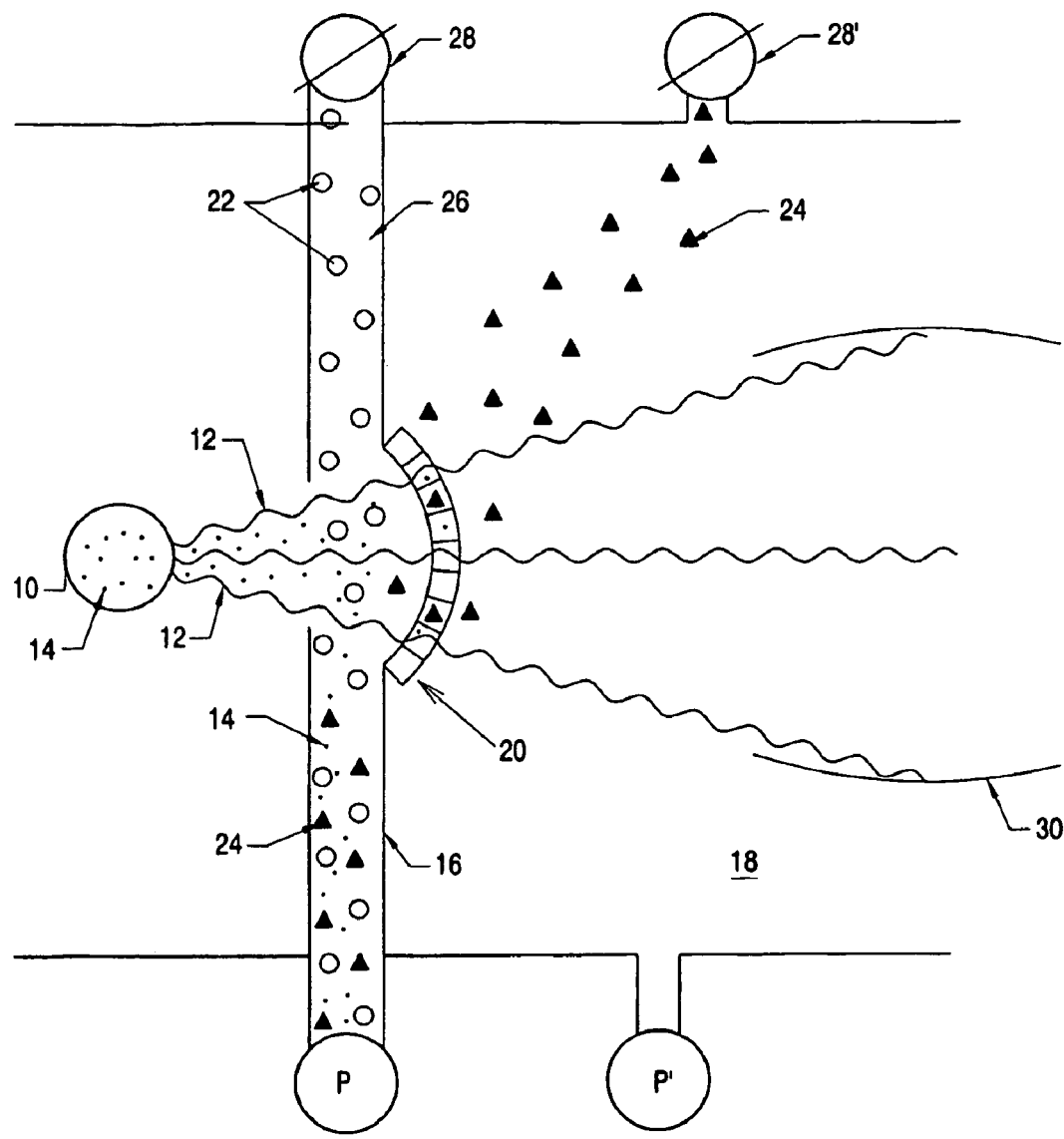

Further advantages and features of the invention can be taken from the following description of several embodiments and the drawings that are referenced herein. It is shown in:

FIG. 1 a schematic cross-section of a first embodiment;

FIG. 2 a schematic cross-section of a device according to a second embodiment; and FIG. 3 a schematic cross-section of a third embodiment.

If not indicated otherwise, identical reference numerals indicate always the same technical features and refer to FIGS. 1 through 3.

FIG. 1 shows a first embodiment of a device according to the invention for removing contaminant particles 14 generated by means of a radiation source 10 during generation of short-wave radiation 12 having a wavelength of up to 20 nm. The contaminant particles 14 include atoms, molecules, clusters, ions, and the like that are generated in the radiation source 10, for example, by means of a plasma emitting the short-wave radiation 12. Particles of a target evaporated by a pulsed focused laser beam are also to be considered as a further source of the contaminant particles 14. Alternatively, the contaminant particles 14 originate from a working gas that is introduced into an electrode gap of a triggered, electrically operated discharge device, not illustrated. In this connection, a typically occurring cathode spot causes erosion of electrode material upon transmission of electrical energy. The electrically conducting high-melting electrode material, for example, molybdenum or tungsten, has the tendency to form clusters. Also, substances that are used as working gas, for example, iodine and tin that enable an especially-efficient generation of short-wave radiation 12, can be converted into clusters with relatively high molecular weight.

A first gas 22 is introduced at high mass throughput between the radiation source 10 and particle trap 20, also referred to as foil trap, that is arranged within the wall 16 of the mirror chamber 18. The first gas 22 that flows at high velocity can transport away in the flow direction of the first gas 22 by entrainment effects particularly the contaminant particles 14 that migrate from the radiation source 10 in the direction of the particle trap 20.

Passing of the contaminant particles 14 through a particle trap 20 can be prevented in this way. Moreover, for example, deposition of contaminant particles 14 or damage to, for example, the reflective components of the particle trap 20 by colliding contaminant particles 14 can be reduced.

In order to prevent penetration of the first gas 22 into the mirror chamber 18, a second gas 24 is introduced into the mirror chamber 18 whose pressure is at least as high as the pressure of the first gas 22. The second gas 24 in the mirror chamber 18 provides essentially a counter pressure. Therefore, the first gas 22 does not flow through the particle trap 20. Entrainment effects between the contaminant particles 14 and first gas 22 in the direction of the mirror chamber 18 are reduced to a minimum.

A valve 28 is provided for adjusting the pressure of the second gas 24. The resulting mixture of particles of the first gas 22 and of contaminant particles 14 is removed by a pump P. The pump P ensures moreover a high mass throughput of the first gas 22.

The first embodiment of the device according to the invention illustrated in FIG. 1 can be used for generating radiation 12 in a wavelength range of approximately 2 nm up to approximately 20 nm for a lithography device (not illustrated). An optical device, arranged in the mirror chamber 18, for example, a mirror, a mask or a wafer can be protected against soiling with the contaminant particles 14.

As illustrated in FIG. 2, the second embodiment of the device according to the invention has a radiation source 10 that generates short-wave radiation 12 and contaminant particles 14. Particularly the contaminant particles 14 having a momentum that is directed in the direction toward the particle trap 20 can be slowed or deflected by means of the first gas 22. In this connection, the pressure of the second gas 24 is adjusted to be higher than the pressure of the first gas 22 by means of the valve 28. The second gas 24 flows through the particle trap 20 and enters the flow of the first gas 22 that transports mainly the contaminant particles 14 toward the pump P.

The first gas 22 is guided transversely to the propagation direction of radiation 12 within a channel 26 that is at least partially laterally bounded. In this way, a preferred direction and a layer thickness can be preset for the first gas 22 wherein the layer thickness can be configured within the area of the particle trap 20 in the form of a continuously maintained gas curtain. Similar to a waterfall, the particles of the first gas 22 entrain the contaminant particles 14.

When the first gas 22 is a noble gas having an atomic weight of at least 39 g/mol, for example, argon or krypton, particularly contaminant particles 14 having a relatively high molecular weight can be removed in the direction of the pump P, for example, by collision. By means of a defined arrangement of the walls 16 of the channel 26, the width of the gas curtain can be adjusted such that the radiation 12 penetrating it is absorbed only minimally. In this way, it is possible to introduce also substances as the first gas 22 that have only minimal transmission with regard to the short-wave radiation 12.

The second embodiment of the device illustrated in FIG. 2 can be used, for example, for generating radiation 12 in the wavelength range of approximately 2 nm up to approximately 20 nm for a microscope.

In the third embodiment illustrated in FIG. 3, the radiation 12 is guided onto an optical device, a mirror 30 in the illustrated embodiment, arranged in the mirror chamber 18.

For preventing additional absorption by means of the contaminant particles 14 or the first gas 22, a substance that is essentially transparent for the radiation 12, for example, helium or hydrogen, is introduced into the mirror chamber 18 as a second gas 24.

LIST OF REFERENCE NUMERALS

| | |
|---|---|
| 10 | radiation source |
| 12 | radiation |
| 14 | contaminant particles |
| 16 | wall |
| 18 | mirror chamber |
| 20 | particle trap |
| 22 | first gas |
| 24 | second gas |
| 26 | channel |
| 28, 28' | valve |
| 30 | mirror |
| P, P' | pump |

The invention claimed is:

1. A method for removing contaminant particles produced by a radiation source during generation of short-wave radiation having a wavelength of up to approximately 20 nm for illuminating an object, the method comprising the act of:
   guiding between the radiation source and the particle trap a first gas at a first side of a particle trap arranged across an opening in a wall of a chamber;
   introducing a second gas into the chamber at a second side of the particle trap, wherein the first side is different from the second side and the object receives the short-wave radiation from the second side; and
   adjusting a pressure of the second gas to be at least as high as a pressure of the first gas so that the second gas flows from the second side to the first side, wherein the second gas is different from the first gas and the second side does not include the first gas.

2. The method according to claim 1, wherein the adjusting act adjusts the pressure of the second gas to be higher than the pressure of the first gas.

3. The method according to claim 1, wherein the guiding act guides the first gas transversely to a propagation direction of the radiation in a channel that is located at the first side and is at least partially laterally bounded for transporting the contaminant particles to a one side of the channel, and wherein the adjusting act causes the second gas to enter the channel and flow with the first gas for transporting the contaminant particles to the one side of the channel.

4. The method according to claim 1, wherein the first gas comprises a noble gas having an atomic weight of at least 39 g/mol.

5. The method according to claim 1, wherein the second gas comprises a substance that is substantially transparent for the radiation, the second gas including helium or hydrogen.

6. The method according to claim 1, further comprising the act of adjusting a flow velocity of the first gas and/or of the second gas.

7. The use of the method according to claim 1, for generating radiation in a wavelength range of approximately 2 nm up to approximately 20 nm for a lithography device.

8. The use of the method according to claim 1, for generating radiation in a wavelength range of approximately 2 nm up to approximately 20 nm for a microscope.

9. The method of claim 1, wherein the act of introducing the second gas prevents the first gas from flowing through the particle trap from the first side to the second side.

10. The method of claim 1, further comprising the act of introducing the first gas from a first source at the first side of the particle trap, wherein the act of introducing the second gas introduces the second gas from a second source at the second side of the particle trap.

11. A device for removing contaminant particles produced by a radiation source during generation of short-wave radiation having a wavelength of up to approximately 20 nm for illuminating an object, comprising:
   a chamber configured to receive a device to be protected against soiling with the contaminant particles;
   a particle trap arranged across an opening in a wall of the chamber, wherein a first gas is guidable at a first side of the particle trap between the radiation source and the particle trap; and wherein a second gas is introducible into the chamber at a second side of the particle trap, wherein the first side is different from the second side and the object receives the short-wave radiation from the second side; and
   an adjustor configured to adjust a pressure of the second gas at the second side of the particle trap to be at least as high as a pressure of the first gas at the first side of the particle trap so that the second gas flows from the second side to the first side, wherein the second gas is different from the first gas and the second side does not include the first gas.

12. The device according to claim 11, wherein the adjustor is further configured to adjust the pressure of the second gas to be higher than the pressure of the first gas.

13. The device according to claim 11, further comprising a channel for guiding the first gas transversely to the propagation direction of the radiation, wherein the channel is at least partially laterally bounded.

14. The device according to claim 13, wherein the channel is located at the first side, wherein the first gas flows in the channel for transporting the contaminant particles to a one side of the channel, and wherein the adjustor is configured to cause the second gas to enter the channel and flow with the first gas for transporting the contaminant particles to the one side of the channel.

15. The device according to claim 11, wherein the first gas comprises a noble gas having an atomic weight of at least 39 g/mol.

16. The device according to claim 11, wherein the second gas comprises a substance that is essentially transparent for the radiation, the second gas including helium or hydrogen.

17. The device according to claim 11, wherein a flow velocity of the first gas and/or of the second gas is adjustable by means of appropriate devices.

18. A lithographic projection apparatus comprising a device according to claim 11.

19. The device of claim 11, wherein the second gas prevents the first gas from flowing through the particle trap from the first side to the second side.

20. The device of claim 11, further comprising:
 a first source at the first side of the particle trap for introducing the first gas at the first side of the particle trap; and
 a second source at the second side of the particle trap for introducing the second gas at the second side of the particle trap.

* * * * *